(12) United States Patent
Kim et al.

(10) Patent No.: US 9,190,440 B2
(45) Date of Patent: Nov. 17, 2015

(54) IMAGE SENSOR AND METHOD FOR FABRICATING THE SAME

(71) Applicant: SK hynix Inc., Gyeonggi-do (KR)

(72) Inventors: Do-Hwan Kim, Gyeonggi-do (KR);
Yun-Hee Yang, Gyeonggi-do (KR);
Dae-Woo Kim, Gyeonggi-do (KR);
Jong-Chae Kim, Gyeonggi-do (KR);
Su-Hwan Lim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/300,948

(22) Filed: Jun. 10, 2014

(65) Prior Publication Data

US 2015/0171133 A1    Jun. 18, 2015

(30) Foreign Application Priority Data

Dec. 18, 2013    (KR) .................. 10-2013-0158162

(51) Int. Cl.
*H01L 29/00* (2006.01)
*H01L 27/146* (2006.01)
*H01L 29/768* (2006.01)

(52) U.S. Cl.
CPC ...... *H01L 27/14623* (2013.01); *H01L 27/1461* (2013.01); *H01L 27/1464* (2013.01); *H01L 27/14612* (2013.01); *H01L 27/14643* (2013.01); *H01L 29/76816* (2013.01); *H01L 29/76825* (2013.01); *H01L 27/14621* (2013.01); *H01L 27/14627* (2013.01)

(58) Field of Classification Search
CPC .................. H01L 29/76816; H01L 27/1461; H01L 27/14612; H01L 29/76825
See application file for complete search history.

(56) References Cited

U.S. PATENT DOCUMENTS

| | | |
|---|---|---|
| 6,518,109 B2 | 2/2003 | Roberds |
| 2012/0273653 A1 | 11/2012 | Hynecek et al. |
| 2014/0367552 A1* | 12/2014 | Hynecek et al. ........... 250/208.1 |

FOREIGN PATENT DOCUMENTS

KR    100799111    1/2008

* cited by examiner

*Primary Examiner* — Ngan Ngo
(74) *Attorney, Agent, or Firm* — IP & T Group LLP

(57) ABSTRACT

An age sensor including a transfer gate formed on a substrate, a photoelectric conversion region formed on a side of the transfer gate, a floating diffusion region with a trench formed on another side of the transfer gate, a barrier layer which covers a bottom of the trench and a conducting layer, which is gap-filled in the trench.

19 Claims, 9 Drawing Sheets

IMAGE SENSOR AND METHOD FOR FABRICATING THE SAME

CROSS-REFERENCE TO RELATED APPLICATIONS

The present application claims priority of Korean Patent Application No. 10-2013-0158162, filed on Dec. 18, 2013, which is incorporated herein by reference in its entirety.

BACKGROUND

1. Field

Exemplary embodiments of the present invention relate to a semiconductor design technology, and more particularly, to an image sensor and a method for fabricating the same.

2. Description of the Related Art

An image sensor is a semiconductor element which changes a photonic image into an electrical signal. Image sensors generally include a plurality of pixels that are arranged in the shape of a two-dimensional matrix. Each of the pixels contains a photoelectric conversion region that generates a photo-charge in response to incident light and uses the photo-charge outputs to output a pixel signal.

However, conventional image sensors generate unwanted photo-charges in regions other than the photoelectric conversion region. The unwanted photo-charges cause noise in the pixel signal resulting in an increased signal to noise ratio and deteriorated image sensor characteristics.

SUMMARY

Exemplary embodiments of the present invention are directed to an image sensor and a method for fabricating the same.

Exemplary embodiments of the present invention may prevent generation of photo-charges which cause noise in the floating diffusion region by forming the floating diffusion region with a barrier layer. Reduction in the signal to noise ratio relative to prior art results in improved image sensor characteristics.

In accordance with an exemplary embodiment of the present invention, an image sensor may include a transfer gate formed on a front-side of a substrate, a photoelectric conversion region formed on a side of the transfer gate, a floating diffusion region including a trench formed on the other side of the transfer gate a barrier layer, which covers a bottom of the trench, and a conducting layer, which is gap-filled in the trench.

The barrier layer may cover the bottom plane of the trench and a portion of the side plane of the trench. The barrier layer may include an insulation layer, which absorbs or reflects incident light. The barrier layer may include a single insulation layer or a stacked layer having a plurality of insulation layers with different refractive indexes. The barrier layer may include a stacked layer where a first insulation layer and a second insulation layer having different refractive indexes are alternately stacked. The conducting layer and the substrate may be composed of the same material. The conducting layer may include a first region of a first conductive type and a second region of second conductive type, which vertically overlap, and wherein the first conductive type and the second conductive type are complementary. The first region and the second region may be electrically coupled to the substrate. The image sensor may further include a color filter formed on a back-side of the substrate, and a micro lens formed on the color filter.

In accordance with an exemplary embodiment of the present invention, an image sensor may include a transfer gate formed on a front-side of a substrate, a photoelectric conversion region formed on a side of the transfer gate, a floating diffusion region including a trench, which is formed in the other side of the transfer gate, a barrier layer, which covers a bottom of the trench, and a conducting layer, which is gap-filled in the trench, and a trap region formed under the trench.

The trap region may be electrically separated from the conducting layer by the barrier layer. A ground voltage may be provided to the trap region. The barrier layer may cover a bottom plane of the trench and a portion of a side of the trench. The barrier layer may include an insulation layer, which absorbs or reflects incident light. The conducting layer and the substrate may be composed of the same material. The conducting layer may include a first region of a first conductive type and a second region of a second conductive type, which overlap vertically, and wherein the first conductive type and the second conductive type are complementary. The first region and the second region may be electrically coupled to the substrate. The image sensor may further include a color filter formed on a back-side of the substrate, and a micro lens formed on the color filter.

In accordance with an exemplary embodiment of the present invention, a method for fabricating an image sensor may include forming a trench by selectively etching a substrate, forming a barrier layer which covers a bottom plane of the trench, forming a floating diffusion region including the trench, the barrier layer and a conducting layer by forming the conducting layer, which is gap-filled in the trench, forming a photoelectric conversion region in the substrate, and forming a transfer gate on the substrate such that the photoelectric conversion region and the floating diffusion region are disposed on a side of the substrate and the other side of the substrate.

The forming of the barrier may include forming the barrier layer along a surface of a structure including the trench, forming a sacrificial layer, which is partially gap-filled in the trench, etching the barrier layer exposed by the sacrificial layer, and removing the sacrificial layer.

DETAILED DESCRIPTION

Figure 1:
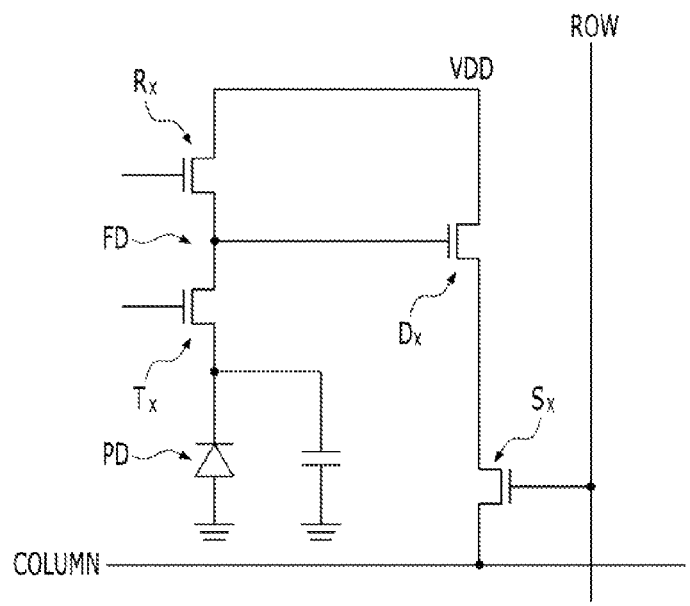
FIG. 1 is an equivalent circuit diagram illustrating an image sensor in accordance with an exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention.

The drawings are not necessarily to scale and, in some instances, proportions may have been exaggerated in order to clearly illustrate features of the embodiments. In this specification, specific terms have been used. The terms are used to describe the present invention and are not used to qualify the sense or limit the scope of the present invention.

It is also noted that in this specification, 'and/or' represents that one or more of components arranged before and after 'and/or' is included. Furthermore, "connected/coupled" refers to one component not only directly coupling another component but also indirectly coupling another component through an intermediate component. In addition, a singular form may include a plural form (and vice versa) as long as it is not specifically mentioned. Furthermore, 'include/comprise' or 'including/comprising' used in the specification represents that one or more components, steps, operations, and elements exist or are added.

Image sensors are classified into charge coupled device (CCD) image sensors and a CMOS image sensors. CMOS image sensors are further classified into front-side illumination (FSI) image sensors and back-side illumination (BSI) image sensors. The BSI image sensor has excellent operation characteristics, low manufacturing cost, and high manufacturing yield compared to other image sensors such as CCD image sensors or FSI image sensors. However, BSI image sensors have concerns regarding noise and signal deterioration caused by high signal to noise ratios.

Examples of BSI image sensors will be described in the embodiments of the present invention. T here will be a first conductive type and a second conductive type, which are complementary. For example, if the first conductive type is a P-type, the second conductive type is an N-type. If the first conductive type is an N-type, the second conductive type is a P-type. For conveniently describing the embodiments of the present invention, it will be assumed that the first conductive type is a P-type and the second conductive type is an N-type.

Embodiments of the present invention include an image sensor and an image sensor fabrication method where characteristic deterioration is prevented by reducing the signal to noise ratio relative to the conventional art. The reduction in signal to noise ratio is accomplished by preventing unwanted photo-charges from being generated in regions other than the photoelectric conversion region. For example, signal noise may result from un-wanted photo-charges being generated in a floating diffusion region (FD). Thus, before describing image sensors in accordance with embodiments of the present invention, an explanation will be given as to why un-wanted photo-charges are generated in regions other than the photoelectric conversion region, e.g., with reference to FIGS. 1 to 3.

Figure 2:
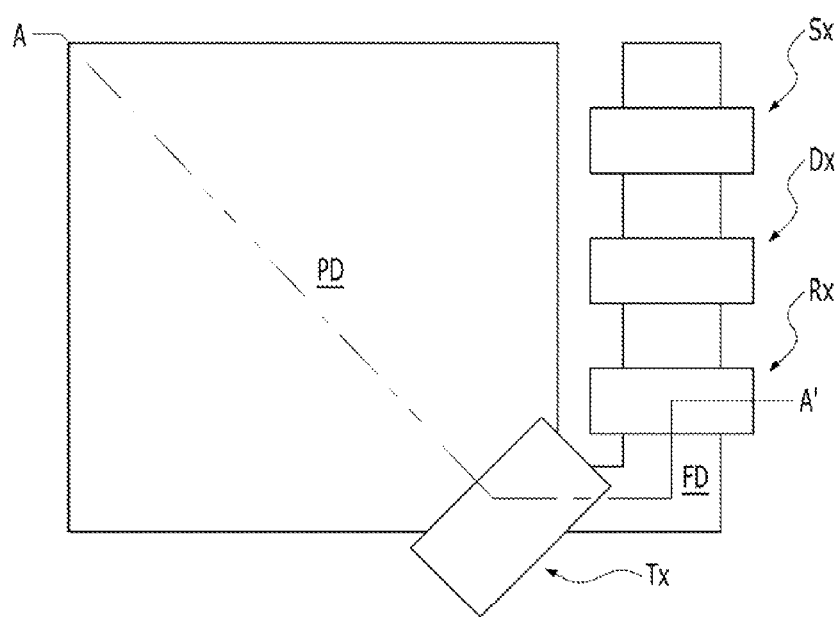
FIG. 2 is a plane diagram illustrating a pixel of an image sensor in accordance with an exemplary embodiment of the present invention.
Figure 3:
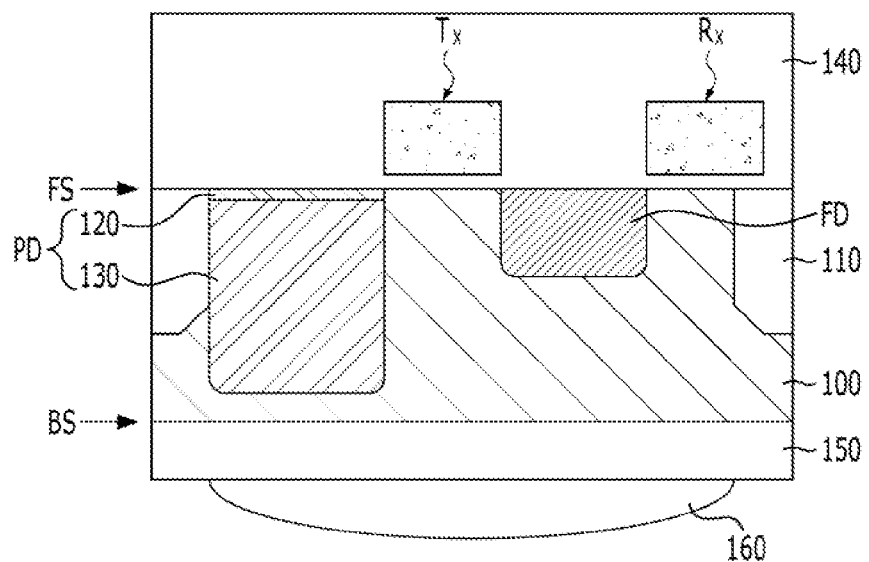
FIG. 3 is a cross sectional view taken along A-A' of FIG. 2 in accordance with an exemplary embodiment of the present invention.

FIG. 1 is an equivalent circuit diagram illustrating an image sensor in accordance with an exemplary embodiment of the present invention. FIG. 2 is a plane diagram illustrating a pixel of an image sensor in accordance with an exemplary embodiment of the present invention. FIG. 3 is a cross sectional view taken along A-A' of FIG. 2 in accordance with an exemplary embodiment of the present invention.

As shown in FIGS. 1 to 3, a pixel of an imager sensor may include a photoelectric conversion region PD, a transfer transistor Tx, a drive transistor Dx, a reset transistor Rx, and a selection transistor Sx. The photoelectric conversion region PD may include a plurality of photoelectric conversion units, which are vertically overlapped. Each of the plurality of photoelectric conversion units may be a photo diode including an N-type impurity region 120 and a P-type impurity region 130. A transfer gate of the transfer transistor Tx may be extended to the inside of the substrate. The transfer gate may include a recess gate, a saddle-fin gate, or a buried gate. A drain of the transfer transistor Tx may be a floating diffusion region M. The floating diffusion region FD may be a source of the reset transistor Rx. The floating diffusion region FD may be electrically coupled to a drive gate of the drive transistor Dx. The drive transistor Dx and the reset transistor Rx may be coupled in series. The drive transistor Dx may be coupled to the selection transistor Sx. Although not shown in drawings, the reset transistor Rx, the drive transistor Dx, and the selection transistor Sx may be shared among neighboring pixels, which may improve integration.

Operation of an image sensor in accordance with an exemplary embodiment of the present invention will be described below with reference to FIG. 1.

As light is blocked, charges remaining on the floating diffusion region FD are discharged by providing a power supply voltage VDD to a drain of the reset transistor Rx and to a drain of the drive transistor Dx. If the reset transistor Rx is switched off, and light reflected from an object is incident on the photoelectric conversion region PD, an electron-hole pair (that is, photo-charge) is generated in the photoelectric conversion region PD. A generated hole is moved to and accumulated on a p-type impurity region, and a generated electron is moved to and accumulated on an N-type impurity region, Subsequently, the transfer transistor Tx is switched on and the accumulated hole and electron are transmitted to and accumulated on the floating diffusion region FD. A gate bias of the drive transistor Dx is changed in proportion to the accumulated charge amount, and the source voltage potential of the drive transistor Dx is changed. If the selection transistor Sx is switched on, a pixel signal is formed by a charge passing through a column line.

Referring to FIG. 3, an element isolation layer 110 may be formed on a substrate 100. A gate of the transfer transistor Tx and a gate of the reset transistor Rx may be formed on the substrate 100. The photoelectric conversion region PD may be formed on a side of the substrate 100. The floating diffusion region FD may be formed on the other side of the substrate 100. The photoelectric conversion region PD and the floating diffusion region FD may be formed by ion-implanting impurities on the substrate 100. An interlayer insulation layer 140, including a signal generation circuit, may be formed on a front-side FS of the substrate 100. A color filter 150 and a micro leas 160 may be formed on a back-side BS of the substrate 100.

A back-side illumination (BSI) image sensor may increase the light-reception area by illuminating light on a back-side of the substrate 100. However, wavelengths with large absorption depth bandwidth, e.g. a wavelength of red or green bandwidth, may generate a photo-charge in a region other than the photoelectric conversion region PD. More specifically, a wavelength of large absorption depth bandwidth may reach the floating diffusion region FD and generate a photo-charge. The intended area to generate a photo-charge is the photoelectric conversion region PD. The charge is accumulated in the floating diffusion region FD and serves to produce a pixel signal. Photo-charges generated in the floating diffusion region FD act as a noise source in the pixel signal and deteriorate the image sensor characteristics. This is especially true when the photoelectric conversion region PD is saturated with photo-charges from a strong light source. This results in an increased signal to noise ratio and deterioration of image sensor characteristics due to photo-charges being generated in the floating diffusion region FD.

Exemplary embodiments of the present invention may provide an image sensor and a method for fabricating the same that prevents unwanted photo-charges from being generated in the floating diffusion region FD.

Figure 4:
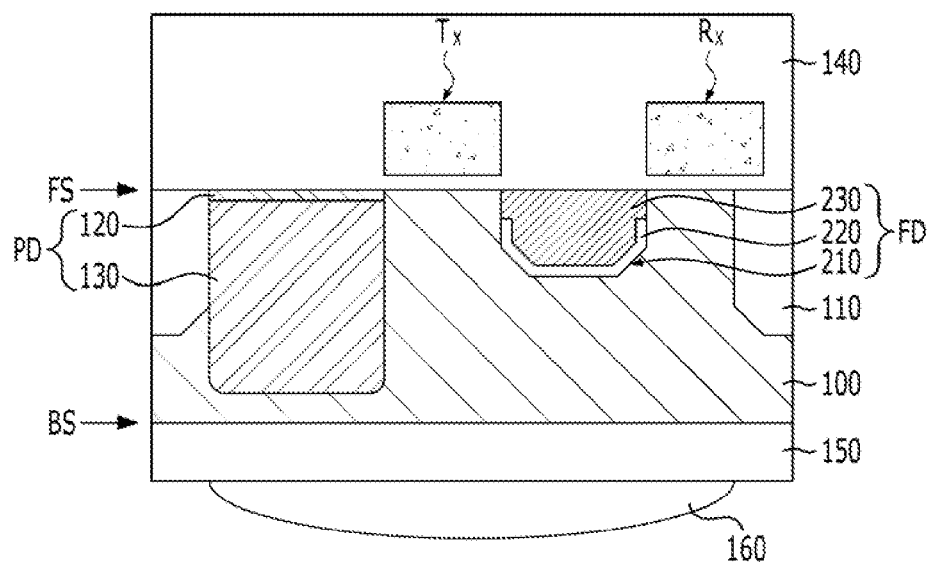
FIG. 4 is a cross sectional view taken along A-A' of FIG. 2 in accordance with an exemplary embodiment of the present invention.

FIG. 4 is a cross sectional view taken along A-A' of FIG. 2 in accordance with an exemplary embodiment of the present invention.

As shown in FIGS. 1, 2 and 4, an image sensor in accordance with an exemplary embodiment of the present invention may include a substrate 100, an element isolation layer 110, a transfer gate of a transfer transistor Tx, a reset gate of a reset transistor Rx, a photoelectric conversion region PD, a floating diffusion region FD, an interlayer insulation layer 140, a color filter 150, and a micro lens 160.

The substrate 100 may include a first conductive type semiconductor substrate. The semiconductor substrate may be in a single crystal state and include a silicon-containing material. For example, the substrate 100 may be a bulk silicon substrate or a silicon layer isolated from a handle wafer.

The element isolation layer 110 may be formed on the front-side FS of the substrate 100. The element isolation layer 110 may be formed by a shallow trench isolation process and may include an insulation layer. A bottom plane of the element isolation layer may be extended to contact with a back-side BS of the substrate 100.

The transfer gate of the transfer transistor Tx and a reset gate of the reset transistor Rx may be formed on the substrate 100.

The photoelectric conversion region PD is formed on a side of the transfer gate of the transfer transistor Tx. The photoelectric conversion region PD may include at least one photoelectric conversion unit, which is vertically overlapped. The photoelectric conversion unit(s) may be a photo diode including a first impurity region 120 of a first conductive type, e.g., P-type impurity region, and a second conductive impurity region 130 of a second conductive type, e.g., N-type impurity region. The first impurity region 120 may have a thickness smaller than the thickness of the second impurity region and may contact the front-side FS of the substrate 100. The second impurity region 130 may be separated from the back-side BS of the substrate 100 or be in contact with the back-side BS of the substrate 100.

The floating diffusion region FD may be formed on the other side of the substrate 100. The floating diffusion region FD may include a trench 210, which is formed in the transfer gate of the transfer transistor Tx; a barrier layer 220, which covers a bottom plane of the trench 210; and a conducting layer 230, which is gap-filled in the trench 210.

The trench 210 may be formed by etching the substrate 100 in an area corresponding to the floating diffusion region. From the front-side FS of the substrate, the trench 210 may have a depth corresponding to that of the floating diffusion region FD and may be formed through an impurity ion-implantation process.

The barrier layer 220 prevents light from the back-side BS of the substrate from reaching the floating diffusion region FD. The barrier layer 220 covers the bottom plane of the trench 210 to efficiently block light coming from the back-side BS of the substrate 100. The barrier layer 220 may be extended to the sides of the trench 210. That is, the barrier layer 220 may cover a bottom plane and a side plane(s) of the trench 210. If the barrier layer 220 is extended to the side plane of the trench 210, the barrier layer 220 may be separated from the front-side FS of the substrate 100 to provide a current path between the photoelectric conversion region PD and the floating diffusion region FD, and between the floating diffusion region FD and a channel region of the reset transistor Rx.

The barrier layer 220 may block light from reaching the floating diffusion region FD by absorption or reflection using an insulation layer. For reference, it is not recommended to use a metallic material as the barrier layer 220 since unwanted photo-charges may be generated by light incident: on an interface between the barrier layer 220 and the substrate 100 or between the barrier layer 220 and the conducting layer 230.

The barrier layer 220 may include a single insulation layer selected from a group comprised of an oxide layer, a nitride layer, and an oxynitride layer, or a stacked layer where two or more of the just mentioned insulation layers are stacked. If the barrier layer 220 has a stacked insulation layer, the stacked insulation layer may be composed of a plurality of insulation layers having different refractive indexes to adjust the absorption rate or reflexibility of incident light. If the barrier layer 220 is a single insulation layer, the barrier layer 220 may be a silicon oxide layer $SiO_2$. If the barrier layer 220 is the stacked layer, a silicon oxide layer $SiO_2$ and a silicon nitride layer $Si_3N_4$ may be alternately stacked once or more.

Light reflected from the barrier layer 220 falls on the photoelectric conversion region PD or exits to the outside. Although an unwanted photo-charge may be generated by light reflected from the barrier layer 220, the probability is low and the effect on signal noise is generally negligible for photo-charges that are generated outside of the floating diffusion region FD.

The conducting layer 230, which is gap-filled in the trench 210, may have a second conductive type, and may operate as a drain of the transfer transistor Tx and a source of the reset transistor Rx. The conducting layer 230 may be contacted with the substrate 100 where no barrier layer 220 is present. That is, the conducting layer 230 may be electrically coupled to the substrate 100. The conducting layer 230 may include the same material as the substrate 100. For example, the conducting layer 230 may include a silicon-containing material, a poly-silicon layer, or a single crystal silicon layer.

The interlayer insulation layer 140 is formed on the front-side FS of the substrate 100 and includes a signal generation circuit. The interlayer insulation layer 140 may be comprised of a single layer or two stacked layers selected from a group comprised of an oxide layer, a nitride layer, and an oxynitride layer. The signal generation circuit formed within the interlayer insulation layer 140 may include a plurality of transistors, metallic lines of a multi-layer (not shown), and a contact plug (not shown), which couples them to each other. The signal generation circuit may generate a pixel signal corresponding to a photo-charge generated in the photoelectric conversion region PD. The plurality of transistors may include the transfer transistors Tx, the reset transistor Rx, the drive transistor Dx, and the selection transistor Sx.

The color filter 150 may be formed on the back-side BS of the substrate 100. The micro lens 160 may be formed on the color filter 150.

The aforementioned image sensor in accordance with the exemplary embodiment of the present invention may prevent unwanted photo-charges from being generated by having a floating diffusion region FD with a barrier layer 220 that blocks light from reaching the floating diffusion region FD. Thus, the image sensor may prevent deterioration of characteristics caused by an increase in signal to noise ratio, particularly when a strong light source is present.

An image sensor in accordance with another exemplary embodiment of the present invention will now be described with reference to FIGS. 5A and 5B. For conveniently describing the embodiment, a detailed description of previously mentioned and common elements will be omitted.

Figure 5A:
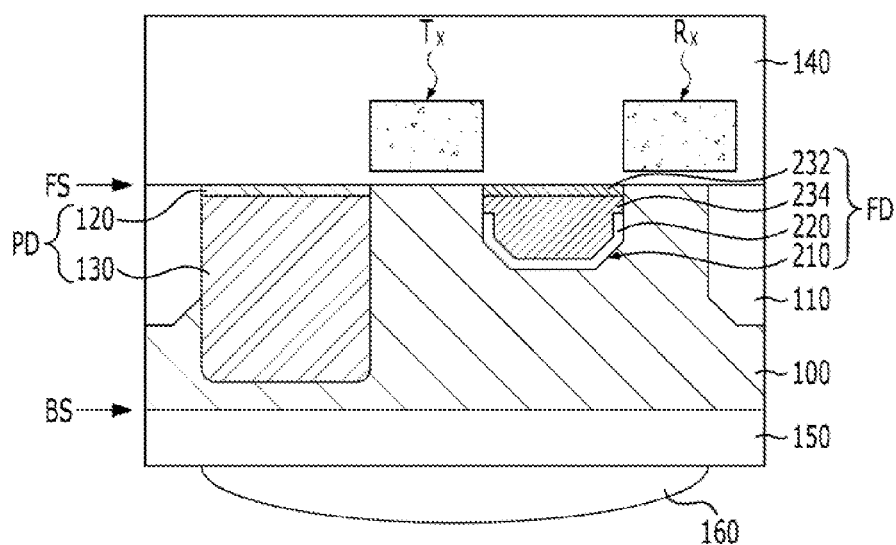
FIGS. 5A and 5B are cross sectional views taken along A-A' of FIG. 2 in accordance with an exemplary embodiment of the present invention.
Figure 5B:
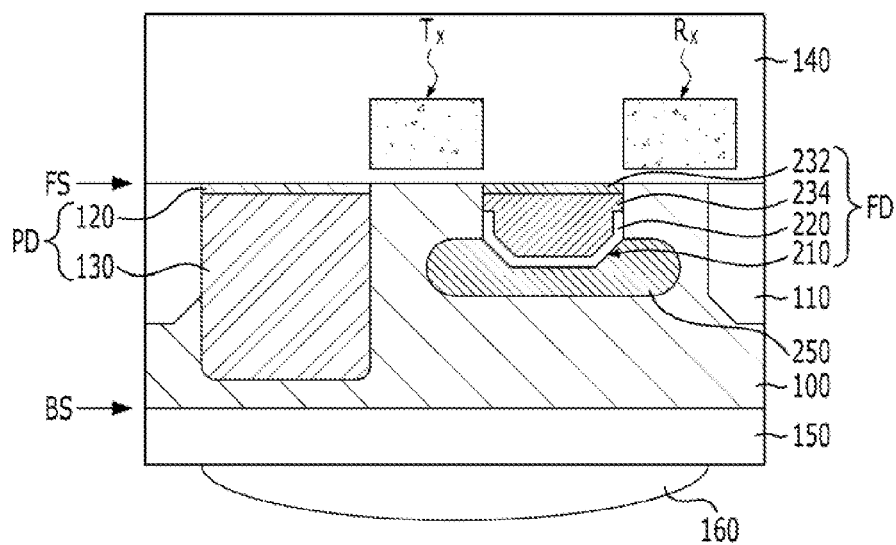

FIGS. 5A and 5B are cross sectional views taken along the A-A' plane of FIG. 2.

As shown in FIG. 5A the conducting layer 230, which is gap-filled in the trench 210 may include a first region 232 having a first conductive type and a second region 234 having a second conductive type, which vertically overlap. The first region 232 and the second region 234 may contact the substrate 100 where the barrier layer 220 is not formed. That is, the first region 232 and the second region 234 may be electrically coupled to the substrate 100.

The first region 232 may prevent the generation of dark current. Thus, the first region 232 may contacted the frontside FS of the substrate 100, a bottom plane of the trench 210, or a side plane of the trench 210. The second region 234 may operate as a drain of the transfer transistor Tx and a source of the reset transistor Rx. The second region 234 may be disposed under the first region 232 or above the first region 232. That is, the first region 232 may be in contact with the frontside FS of the substrate 100. The second region 234 may be disposed under the first region 232, or the first region 232 may be disposed under the second region 234.

Assuming the conducting layer 230 includes the first region 232 and the second region 234, the conducting layer 230 may prevent unwanted photo-charges from being generated in the floating diffusion region FD, reduce dark current, and improve image sensor characteristics.

As shown in FIG. 5B, a trap region 250 may be formed under the floating diffusion region FD. The trap region 250 may remove the dark current from the surface of the trench 210 and may remove unwanted photo-charges generated by the light reflected from the barrier layer 220.

The trap region 250 may be an impurity region, which is formed by ion-implanting an impurity of the first conductive type on the substrate 100. The trap region 250 may be electrically separated from the conducting layer 230 by the barrier layer 220 to prevent the generation of photo-charges caused by a junction between the trap region 250 and the conducting region 230. The trap region 250 may be grounded.

As described above, if the trap region 250 is formed under the floating diffusion region FD, the trap region 250 prevents the unwanted photo-charges from being generated in the floating diffusion region FD, which improves image sensor characteristics and reduces dark current. Additionally, the signal to noise ratio may be reduced by removing the unwanted photo-charges generated by light reflected from the barrier layer 220.

FIGS. 6A to 6E are cross sectional views illustrating a method for fabricating an image sensor in accordance with an exemplary embodiment of the present invention. A method for fabricating the image sensor shown in FIG. 4 will now be described.

Figure 6A:
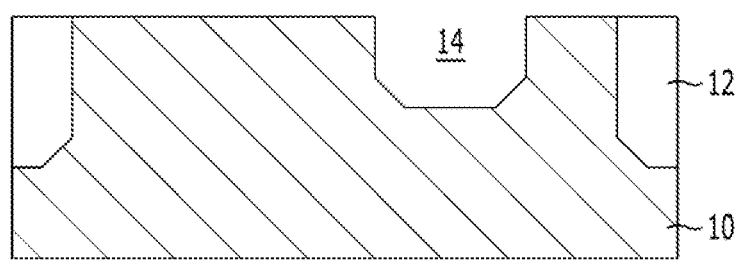
FIGS. 6A to 6E are cross sectional views illustrating a method for fabricating an image sensor in accordance with an exemplary embodiment of the present invention.

As shown in FIG. 6A, a substrate 10 having a first conductive type is prepared. The semiconductor substrate may be in a single crystal state and may include a silicon-containing material.

Next, an element isolation layer 12 may be formed in the substrate 10. The element isolation layer 12 may be formed through a shallow trench isolation (STI) process. That is, the element isolation layer 12 may be formed by first producing an element isolation trench via selectively etching the substrate 10. An insulation layer may then be gap-filled in the element isolation trench, Subsequently, a trench 14 may be formed by etching the substrate 14 in an area that will be the floating diffusion region FD. The trench 14 may be formed using an etching process to provide space for forming the floating diffusion region FD.

Figure 6B:
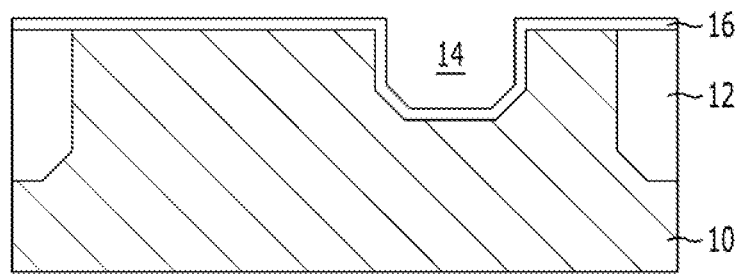

As shown in FIG. 6B, a barrier layer 16 may be formed along a surface of the substrate 10, including the trench 14. The barrier layer 16 may prevent photo-charges from being generated in the floating diffusion region FD and block light from reaching the floating diffusion region FD. The barrier layer 16 may include a material such as an insulation layer which absorbs or reflects the incident light. Specifically, the barrier layer 16 may include a single layer or a stacked layer of two or more materials selected from a group comprised of an oxide layer, a nitride layer, and an oxynitride layer. For example, the barrier layer 16 may be formed of a silicon oxide layer or at least two stacked layers where a silicon oxide layer and a silicon nitride layer are alternately stacked.

A pre-treatment process for curing surface defects of the trench 14 may be performed prior to formation of the barrier layer 16. The pre-treatment process may use an anneal process, e.g. a fast heat treatment or a laser anneal. Further, the pre-treatment process may cure surface defects of the trench 14 by forming a sacrificial layer on the surface of the structure, including the trench 14, through thermal oxidation followed by removal of the sacrificial layer. For reference, surface defects of the trench 14 may operate as a source of a dark current.

Figure 6C:
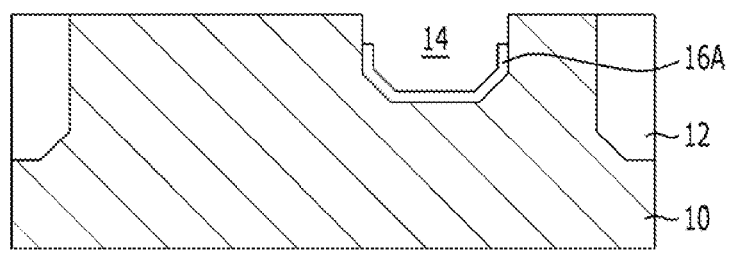

As shown in FIG. 6C, a bottom plane of the trench 14 may be covered by selectively etching the barrier layer 16. The portion of the barrier layer which is etched to cover the bottom plane of the trench 14 will now be referred to as '16A'.

By etching the barrier layer 16A to cover the bottom of the trench 14, the incident light is prevented from reaching the floating diffusion region FD, a current path is provided between the photoelectric conversion region PD and the floating diffusion region FD, and between a channel region of the reset transistor Rx and the floating diffusion region FD. The barrier layer 16A covers the bottom of the trench 14 and may be extended to the side(s) of the trench 14.

An etching process for the barrier layer 16A may be accomplished by forming a sacrificial layer (not shown) to bury part of the trench 14 in the barrier layer 16A, etching an exposed barrier layer 16A, and removing the sacrificial layer. The etching process may be performed through a wet etching process to prevent substrate defects from occurring.

Figure 6D:
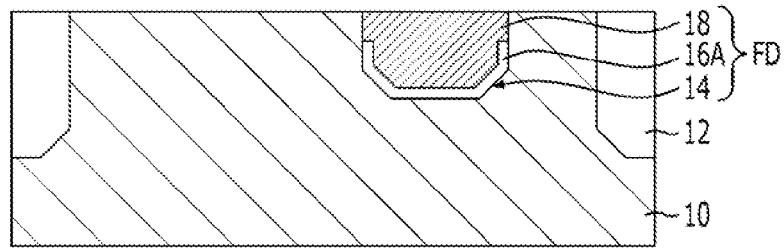

As shown in FIG. 6D, a conducting layer 18 of a second conducting type is gap-filled in the trench 14. A conducting layer 18 gap-fill process may be accomplished by forming the conducting layer 18 to cover the entire surface of the substrate 10, including the trench 14, and performing a planarization process, e.g., a chemical mechanical polishing (CMP) until the surface of the substrate 10 is exposed. During the forming of the conducting layer 18, an impurity of the second conducting type may be implanted in situ, or the impurity of the second conducting type may be ion-implanted after the second conducting layer 18 is formed.

The conducting layer 18 and the substrate 10 may be composed of the same material. More specifically, the conducting layer 18 may include a silicon-containing material. That is, the conducting layer 18 may include a poly-silicon layer or a single crystal silicon layer. The single crystal silicon layer may be formed through an epitaxial growth manner by using a seed as the surface of the trench 14 on which the barrier layer 16A is not formed.

Thus, the floating diffusion region FD including the trench 14, the barrier layer 16A, and the conducting layer 18 may be formed. The barrier layer 16A may cover at least the bottom of the trench 14 and the conducting layer 18 may be gap-filled in the trench 14.

If the conducting layer 18 of the floating diffusion region FD is formed with a material layer having a crystal structure different from the substrate, e.g., a poly-silicon layer, a post-treatment may be performed to improve interface characteristics of the junction between the substrate 10 and the conducting layer 18. The post-treatment may be performed through a laser annealing process.

Figure 6E:
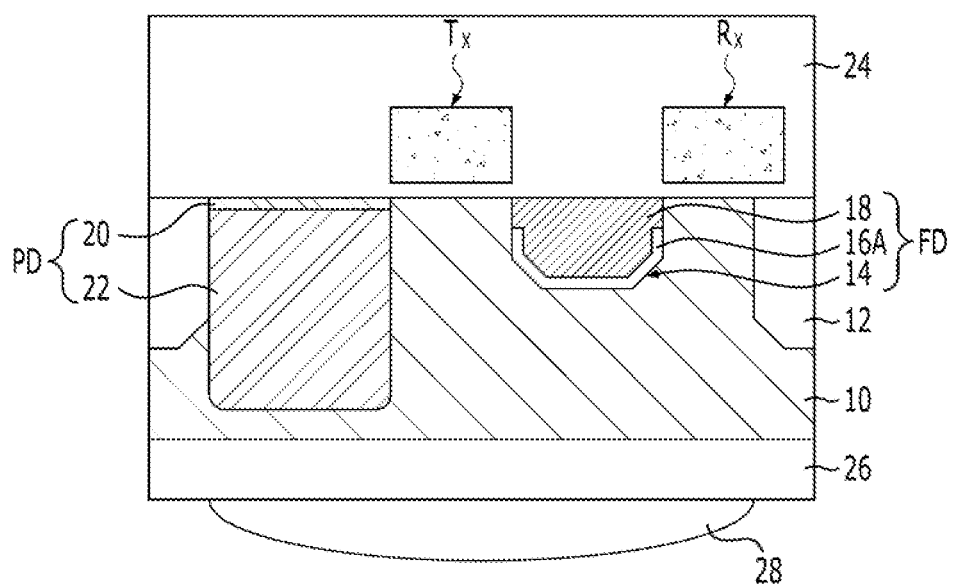

As shown in FIG. 6E, the photoelectric conversion region PD may be formed in the substrate 10. The photoelectric conversion region PD may have a first impurity region 20 of a first conducting type and a second impurity type region 22 of a second conducting type, which vertically overlap each other. The first impurity region 20 and the second impurity region 22 may be formed through an ion-implantation process.

Subsequently, the transfer transistor Tx may be formed such that the photoelectric conversion region PD and the floating diffusion region FD are disposed on different sides of the substrate 10. Further, an interlayer insulation layer 24 including a signal generation circuit of the reset transistor Rx, the drive transistor Dx, the selection transistor Sx, metallic lines of a multi-layer, and a plurality of contact plugs, may be formed.

Next, a color filter 26 may be formed on a back-side BS of the substrate 10, and a micro lens 28 may be formed on the color filter 26. Although not shown in the drawings, an image sensor may be completed by using a published fabricating process.

Figure 7:
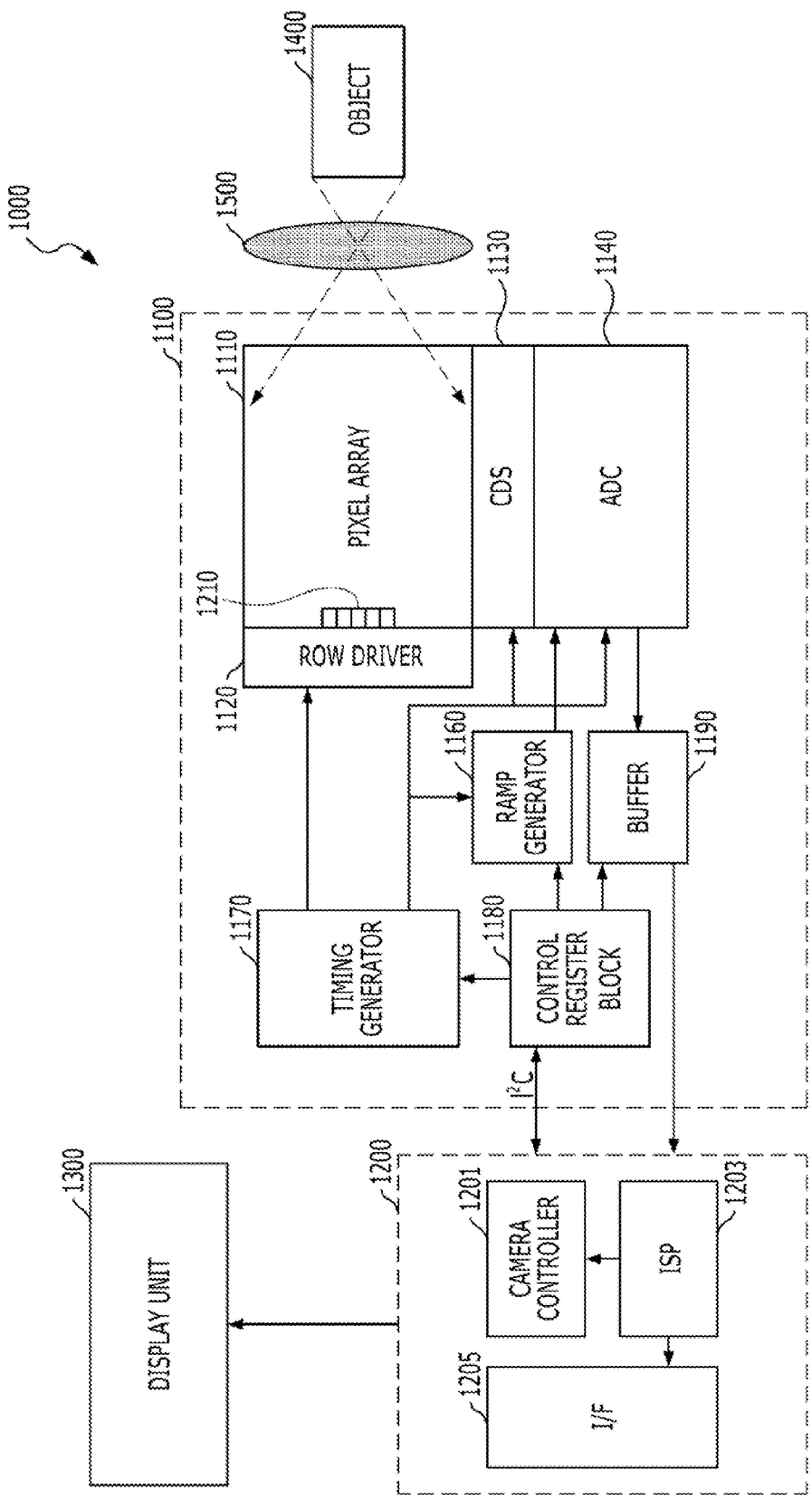
FIG. 7 is a block diagram illustrating an image processing system in accordance with an exemplary embodiment of the present invention.

FIG. 7 is a block diagram illustrating an image processing system in accordance with an exemplary embodiment of the present invention.

Referring to FIG. 7, the image processing system 1000 may include an image sensor 1100, a digital signal processor (DSP) 1200, a display unit 1300 and a lens module 1500.

The image sensor 1100 may include a pixel array 1110, a row driver 1120, a correlated double sampling (CDS) block 1130, an analogue to digital converter (ADC) 1140, a ramp signal generator 1160, a timing generator 1170, a control register 1180 and a buffer 1190.

The pixel array 1110 may include the above-described floating diffusion region FD in accordance with an exemplary embodiment of the present invention. More specifically, each of the plurality of pixels of the pixel array 1110 may include the floating diffusion region FD, which includes the transfer gate formed on the substrate, the photoelectric conversion region PD formed on a side of the transfer gate, the trench formed on the other side of the transfer gate, the barrier layer covering a bottom plane of the trench, and the conducting layer, which is gap-filled in the trench. The above-described floating diffusion region FD blocks unwanted photo-charges from being generated by blocking light from reaching the floating diffusion region FD. Thus, the characteristics of the image sensor may be improved by reducing the signal to noise ratio.

The image sensor 1100 may detect an optical image of an object 1400 photographed by the lens module 1500 under the control of the digital signal processor (DSP) 1200. The digital signal processor (DSP) 1200 may output to the display unit 1300 an image detected and outputted by the image sensor 1100. The display unit 1300 may represent a device capable of displaying the image outputted from the digital signal processor (DSP) 1200. For example, the display unit 1300 may be a terminal of a computer, a mobile communication apparatus, or another image display apparatus.

The digital signal processor (DSP) 1200 may include a camera controller 1201, an image signal processor (ISP) 1203 and an interface (I/F) 1205.

The camera controller 1201 may control operation of the control resistor 1180. The camera controller 1201 may control operation of the image sensor 1100 or the control register 1180 by using an inter-integrated circuit $I^2C$.

The image signal processor (ISP) 1203 may receive an image or image data, process the received image and output the processed image through the interface (I/F) 1205 to the display unit 1300.

For example, FIG. 7 shows that the image signal processor (ISP) 1203 is included in the digital signal processor (DSP) 1200. The image signal processor (ISP) 1203 may be disposed in the image sensor 1100 according to system design. The image sensor 1100 and the image signal processor (ISP) 1203 may be put together in a package, for example as a multi-chip package (MCP).

Figure 8:
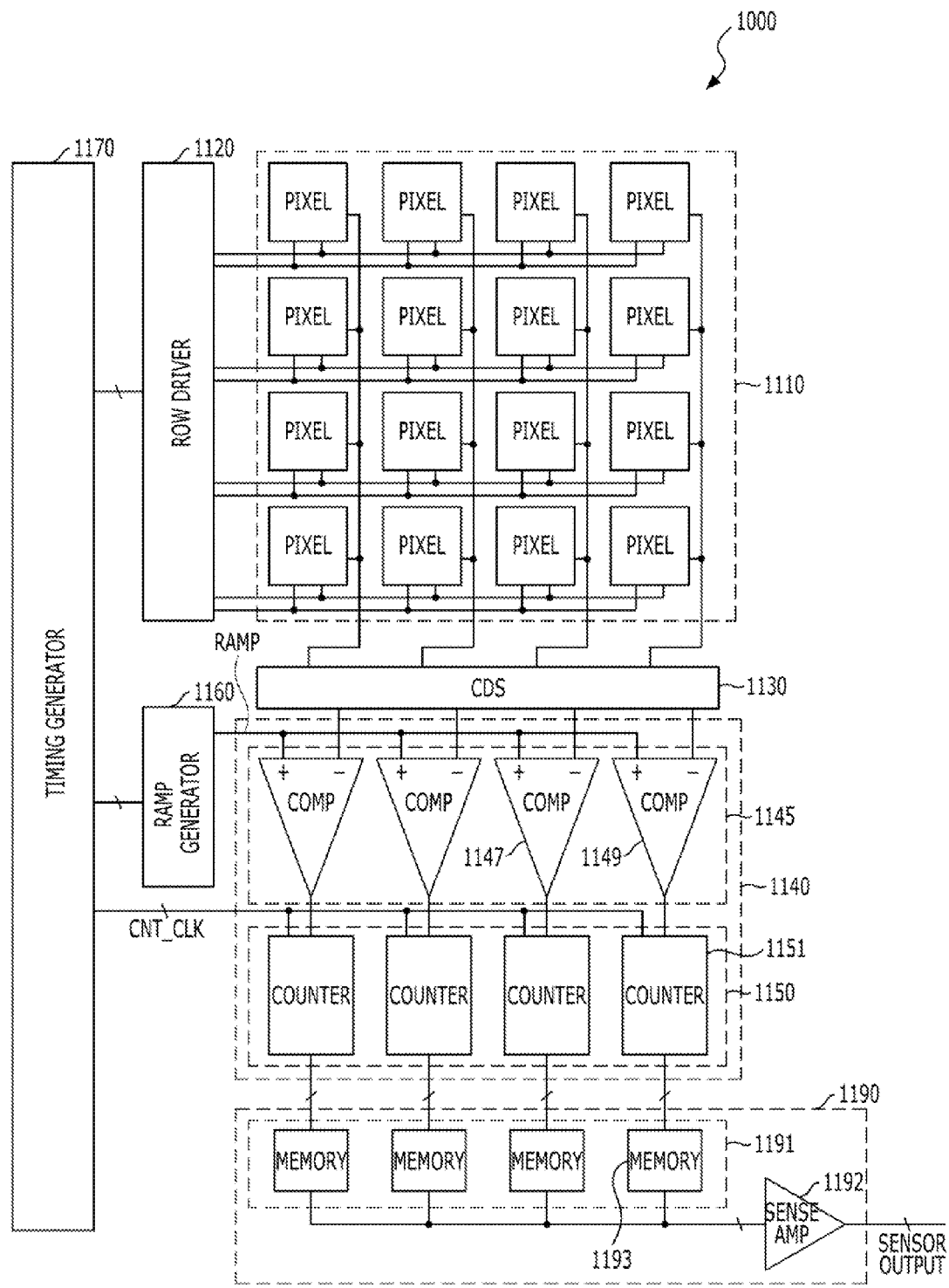
FIG. 8 is a detailed block diagram illustrating an image sensor shown in FIG. 7.

FIG. 8 is a detailed block diagram illustrating an image sensor shown in FIG. 7.

Referring to FIGS. 7 and 8, the timing generator 1170 may generate one or more control signals for controlling each of the row driver 1120, the correlated double sampling (CDS) block 1130, the analogue to digital converter (ADC) 1140, and the ramp signal generator 1150. The control register 1180 may generate one or more control signals for controlling the ramp signal generator 1160, the timing generator 1170, and the buffer 1190. The control register 1180 may be controlled by the camera controller 1201.

The row driver 1120 may drive the pixel array by a row as a unit. For example, the row driver 1120 may generate a selection signal for selecting one of the plurality of rows. Each of the plurality of rows may include a plurality of pixels. FIG. 8 shows a simplified disposition of the plurality of pixels for a clearer description. The plurality of pixels may include the pixel array described above.

The plurality of pixels may detect incident light and output an image reset signal and an image signal to the correlated double sampling (CDS) block 1130. The pixel array in accordance with the present invention may prevent generation of dark current and deterioration of sensitivity due to the charge trap region. This may provide a good quality pixel signal, image reset signal, and image signal. The correlated double sampling (CDS) block 1130 may perform a correlated double sampling on each of the received image reset signals and the image signals.

The analogue to digital converter (ADC) 1140 may compare a ramp signal outputted from the ramp signal generator 1160 and the correlated double sampled signal outputted from the correlated double sampling (CDS) block 1130 to output a comparison result signal, count transition time of the comparison result signal, and output the counted value to the buffer 1190.

The analogue to digital converter (ADC) 1140 may include a comparing block 1145 and a counter block 1150. The comparing block 1145 may include a plurality of comparators 1149. Each of the plurality of comparators 1149 may be connected to the correlated double sampling (CDS) block 1130 and the ramp signal generator 1160. The plurality of output signals from the correlated double sampling (CDS) block 1130 may be inputted to a first terminal, for example a negative terminal, of the respective comparators 1149 and the ramp signal from the ramp signal generator 1160 may be inputted to a second terminal, for example a positive terminal, of each of the comparators 1149.

The plurality of comparators 1149 may receive and compare the respective output signals from the correlated double sampling (CDS) block 1130 and the ramp signal from the ramp signal generator 1160 and output the comparison result signals. For example, a comparison result signal outputted from a first comparator 1149, for comparing an output signal from one of the plurality of pixels and the ramp signal from the ramp signal generator 1160, may correspond to a difference between the image signal and the image reset signal that varies depending on the amount of light received.

The ramp signal generator 1160 may operate under the control of the timing generator 1170.

The counter block 1150 may include a plurality of counters 1151. The plurality of counters 1151 may be connected to respective output terminals of the plurality of comparators 1149. The counter block 1150 may count the transition time of the comparison result signal using a clock signal CNT_CLK outputted from the timing generator 1170 and output a digital signal or the counted value to the buffer 1190. The counter block 1150 may output a plurality of digital image signals. Each of the counters 1151 may be an up/down counter or a bit-wise inversion counter.

The buffer 1190 may store, sense, amplify, and output the plurality of digital image signals outputted from the analogue to digital converter (ADC) 1140. The buffer 1190 may include a memory block 1191 and a sense amplifier 1192. The memory block 1191 may include a plurality of memories 1193 storing the respective counted value outputted from the plurality counters 1151. For example, the counted value may represent a counted value with respect to a signal outputted from the plurality of pixels.

The sense amplifier 1192 may sense and amplify each of the counted values outputted from the memory block 1191. The image sensor 1100 may output the image data to the digital signal processor (DSP) 1200.

Figure 9:
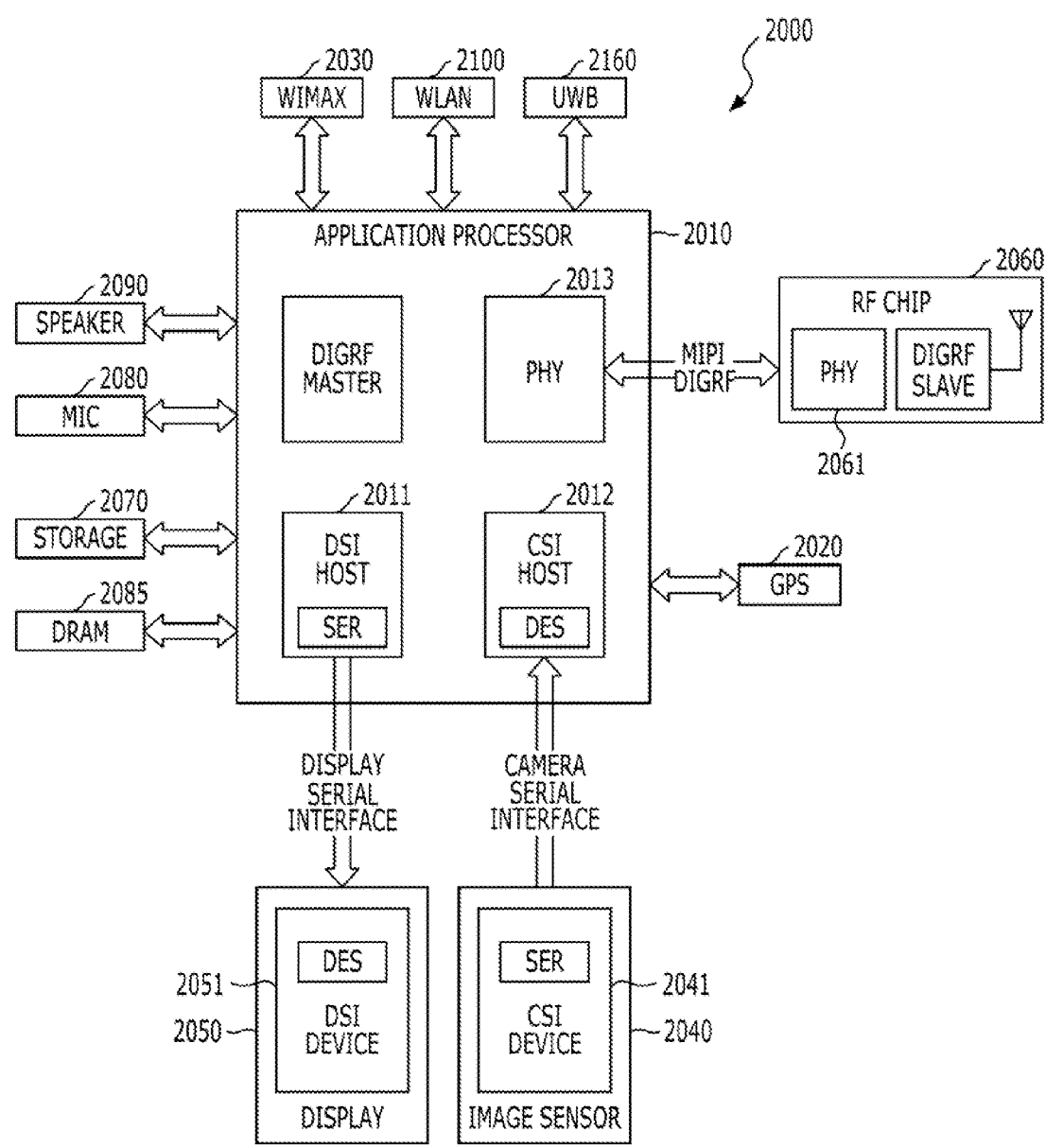
FIG. 9 is a block diagram illustrating an image processing system in accordance with an exemplary embodiment of the present invention.

FIG. 9 is a block diagram illustrating an image processing system including an image sensor in accordance with an embodiment of the present invention.

Referring to FIG. 9, the image processing system 2000 may be a data processing apparatus using or supporting mobile industry processor interfaces (MIPI) such as a mobile communication apparatus, a personal digital assistant (PDA), a mobile phone, or a smart phone. The image processing system 2000 may be a portable apparatus such as a tablet computer.

The image processing system 2000 may include an application processor 2010 an image sensor 2040, and a display 2050.

A camera serial interface (CSI) host 2012 in the application processor 2010 may perform serial communication with the CSI device 2041 of the image sensor 2040 through a camera serial interface (CSI). The image sensor 2040 may include the image sensor in accordance with an embodiment of the present invention. A display serial interface (DSI) host 2011 may perform serial communication with the DSI device 2051 of the display 2050 through a display serial interface (DSI).

The image processing system 2000 may further include a radio frequency (RF) chip 2060 capable of performing communication with the application processor 2010. A physical layer (PHY) 2013 of the application processor 2010 and a physical layer (PHY) 2061 of the radio frequency (RF) chip 2060 may exchange data according to mobile industry processor interface (MPI) digital radio frequency (DigRF), The image processing system 2000 may further include a geographic positioning system (GPS) 2020, a data storage device 2070, a memory 2085 such as dynamic random access memory (DRAM), and a speaker 2090. The image processing system 2000 may perform communication through a worldwide interoperability for microwave access (Wimax) unit 2030, a wireless local area network (WLAN) unit 2100 and an ultra-wideband (UWB) unit 2110.

While the present invention has been described with respect to specific embodiments, it will be apparent to those skilled in the art that various changes and modifications may be made without departing from the spirit and scope of the invention as defined in the following claims.

What is claimed is:

1. An image sensor, comprising:
   a transfer gate formed on a front-side of a substrate;
   a photoelectric conversion region formed on a side of the transfer gate;
   a floating diffusion region including a trench formed on another side of the transfer gate, a barrier layer, which covers a bottom of the trench, and a conducting layer, which is gap-filled in the trench.

2. The image sensor of claim 1, wherein the barrier layer covers the bottom plane of the trench and a portion or all of the side plane of the trench.

3. The image sensor of claim 1, wherein the barrier layer includes an insulation layer, which absorbs or reflects light.

4. The image sensor of claim 3, wherein the barrier layer includes a single insulation layer or a stacked layer having a plurality of insulation layers with different refractive indexes.

5. The image sensor of claim 3, wherein the barrier layer includes a stacked layer having a first insulation layer and a second insulation layer with different refractive indexes that are alternately stacked.

6. The image sensor of claim 1, wherein the conducting layer and the substrate are comprised of the same material.

7. The image sensor of claim 1, wherein the conducting layer includes a first region of a first conductive type and a second region of a second conductive type, which are vertically overlapped, and wherein the first conductive type and the second conductive type are complementary.

8. The image sensor of claim 7, wherein the first region and the second region are electrically coupled to the substrate.

9. The image sensor of claim 1, further comprising:
   a color filter formed on a back-side of the substrate; and
   a micro lens formed on the color filter.

10. An image sensor, comprising:
    a transfer gate fanned on a front-side of a substrate;
    a photoelectric conversion region formed on a side of the transfer gate;
    a floating diffusion region including a trench, which is formed on the other side of the transfer gate, a barrier layer, which covers a bottom of the trench, and a conducting layer, which is gap-filled in the trench; and
    a trap region formed under the trench.

11. The image sensor of claim 10, wherein the trap region is electrically separated from the conducting layer by the barrier layer.

12. The image sensor of claim 10, wherein a ground voltage is provided to the trap region.

13. The image sensor of claim 10, wherein the barrier layer substantially covers a bottom plane of the trench and a portion of a side of the trench.

14. The image sensor of claim 10, wherein the barrier layer includes an insulation layer suitable for absorbing or reflecting light.

15. The image sensor of claim 10, wherein the conducting layer and the substrate are comprised of a same material.

16. The image sensor of claim 10, wherein the conducting layer includes a first region of a first conductive type and a second region of a second conductive type, which are vertically overlapped with each other, and wherein the first conductive type and the second conductive type are complementary.

17. The image sensor of claim 16, wherein the first region and the second region are electrically coupled to the substrate.

18. The image sensor of claim 10, further comprising:
a color filter formed on a back-side of the substrate; and
a micro lens formed on the color filter.

19. An image sensor, comprising:
a floating diffusion region with a barrier layer suitable for preventing the generation of unwanted charges in the floating diffusion layer,
wherein the barrier layer covers a bottom plane of a trench formed on a side of a transfer gate and a portion or all of a side plane of the trench.

* * * * *